(12) United States Patent
Hatakeyama et al.

(10) Patent No.: US 7,001,707 B2
(45) Date of Patent: Feb. 21, 2006

(54) RESIST COMPOSITIONS AND PATTERNING PROCESS

(75) Inventors: Jun Hatakeyama, Niigata-ken (JP); Yuji Harada, Niigata-ken (JP); Yoshio Kawai, Niigata-ken (JP); Masaru Sasago, Hirakata (JP); Masayuki Endo, Kishiwada (JP); Shinji Kishimura, Itami (JP); Kazuhiko Maeda, Tokyo (JP); Haruhiko Komoriya, Kawagoe (JP); Kazuhiro Yamanaka, Kawagoe (JP)

(73) Assignees: Shin-Etsu Chemical Co., Ltd., Tokyo (JP); Matsushita Electric Industrial Co., Ltd., Osaka (JP); Central Glass Co., Ltd., Yamaguchi-ken (JP)

( * ) Notice: Subject to any disclaimer, the term of this patent is extended or adjusted under 35 U.S.C. 154(b) by 1 day.

(21) Appl. No.: 10/925,014

(22) Filed: Aug. 25, 2004

(65) Prior Publication Data

US 2005/0084796 A1    Apr. 21, 2005

(30) Foreign Application Priority Data

Aug. 26, 2003  (JP) .............................. 2003-301500

(51) Int. Cl.
 G03F 7/004  (2006.01)
 C08F 114/18 (2006.01)

(52) U.S. Cl. .................. 430/270.1; 430/326; 430/907; 526/242; 526/281

(58) Field of Classification Search ............. 430/270.1, 430/326, 907; 526/242, 281
See application file for complete search history.

(56) References Cited

U.S. PATENT DOCUMENTS

| 4,491,628 | A | 1/1985 | Ito et al. | |
|---|---|---|---|---|
| 5,310,619 | A | 5/1994 | Crivello et al. | |
| 6,790,591 | B1 * | 9/2004 | Harada et al. | 430/270.1 |
| 6,866,983 | B1 * | 3/2005 | Hatakeyama et al. | 430/270.1 |
| 6,875,556 | B1 * | 4/2005 | Harada et al. | 430/270.1 |

FOREIGN PATENT DOCUMENTS

| JP | 63-27829 A | 2/1988 |
|---|---|---|
| JP | 2-27660 B2 | 6/1990 |
| JP | 03009329 * | 1/1991 |
| JP | 5-158239 A | 6/1993 |
| JP | 5-232706 A | 9/1993 |
| JP | 5-249662 A | 9/1993 |
| JP | 5-249683 A | 9/1993 |
| JP | 5-257282 A | 10/1993 |
| JP | 5-289322 A | 11/1993 |
| JP | 5-289340 A | 11/1993 |
| JP | 9-73173 A | 3/1997 |
| JP | 9-230595 A | 9/1997 |
| JP | 10-10739 A | 1/1998 |
| JP | 2001-146505 A | 5/2001 |
| WO | WO 97/33198 A1 | 9/1997 |

OTHER PUBLICATIONS

Derwent abstract of JP 03009329A, Jan. 1991.*
Ito et al., Spie 2001, vol. 4345 p. 273 to 264.
Kodama et al., Spie 2002, vol. 4690 p. 76 to 83.

* cited by examiner

Primary Examiner—Rosemary Ashton
(74) Attorney, Agent, or Firm—Birch, Stewart, Kolasch & Birch, LLP

(57) ABSTRACT

A resist composition comprising a blend of a cyclic polymer having alcoholic groups as soluble groups and a polymer having carboxyl or hexafluoroalcohol groups whose hydrogen atoms are replaced by acid labile groups as a base resin forms a resist film which is improved in transparency, alkali dissolution contrast and plasma etching resistance.

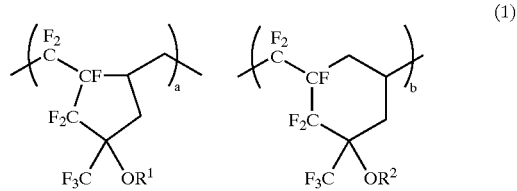

(1)

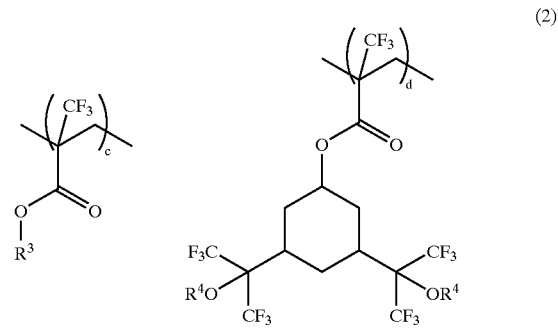

(2)

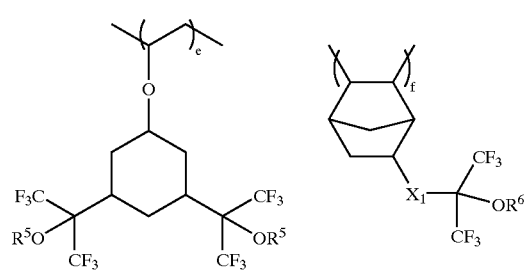

8 Claims, No Drawings

RESIST COMPOSITIONS AND PATTERNING PROCESS

CROSS-REFERENCE TO RELATED APPLICATION

This Nonprovisional application claims priority under 35 U.S.C. §119(a) on Patent Application No. 2003-301500 filed in Japan on Aug. 26, 2003, the entire contents of which are hereby incorporated by reference.

This invention relates to resist compositions suited for microfabrication, especially chemical amplification resist compositions, and a patterning process using the same.

BACKGROUND OF THE INVENTION

In the drive for higher integration and operating speeds in LSI devices, the pattern rule is made drastically finer. The rapid advance toward finer pattern rules is grounded on the development of a projection lens with an increased NA, a resist material with improved performance, and exposure light of a shorter wavelength. To the demand for a resist material with a higher resolution and sensitivity, chemical amplification positive working resist materials which are catalyzed by acids generated upon light exposure are effective as disclosed in U.S. Pat. No. 4,491,628 and U.S. Pat. No. 5,310,619 (JP-B 2-27660 and JP-A 63-27829). They now become predominant resist materials especially adapted for deep UV lithography.

Also, the change-over from i-line (365 nm) to shorter wavelength KrF excimer laser (248 nm) brought about a significant innovation. Resist materials adapted for KrF excimer lasers enjoyed early use on the 0.30 micron process, passed through the 0.25 micron rule, and currently entered the mass production phase on the 0.18 micron rule. Engineers have started investigation on the 0.15 micron rule, with the trend toward a finer pattern rule being accelerated.

For ArF excimer laser (193 nm), it is expected to enable miniaturization of the design rule to 0.13 μm or less. Since conventionally used novolac resins and polyvinylphenol resins have very strong absorption in proximity to 193 nm, they cannot be used as the base resin for resists. To ensure transparency and dry etching resistance, some engineers investigated acrylic and alicyclic (typically cycloolefin) resins as disclosed in JP-A 9-73173, JP-A 10-10739, JP-A 9-230595 and WO 97/33198.

With respect to $F_2$ laser (157 nm) which is expected to enable further miniaturization to 0.10 μm or less, more difficulty arises in insuring transparency because it was found that acrylic resins which are used as the base resin for ArF are not transmissive to light at all and those cycloolefin resins having carbonyl bonds have strong absorption. It was also found that poly(vinyl phenol) which is used as the base resin for KrF has a window for absorption in proximity to 160 nm, so the transmittance is somewhat improved, but far below the practical level.

It was reported in SPIE 2001, Vol. 4345, p. 273, that copolymers of tert-butyl α-trifluoromethylacrylate with 5-(2-hydroxy-2,2-bistrifluoromethyl)ethyl-2-norbornene and copolymers of tert-butyl α-trifluoromethylacrylate with 3-(hydroxybistrifluoromethyl)methylstyrene are appropriate resist polymers featuring high transparency and dry etching resistance. These polymers, however, have an absorbance of about 3. Only examples in which films of about 1,000 Å thick are patterned are reported therein. There is a need for further improvement in transmittance. It is generally believed that an absorbance of 2 or less is necessary to form a rectangular pattern at a film thickness of at least 2,000 Å. However, polymeric materials satisfying all the requirements of dry etching resistance, alkali solubility, substrate adherence and transparency have never been reported.

Furthermore, a highly transparent resin is described in SPIE 2002, Vol. 4690, p. 76. Owing to its absorbance of up to 1 and good substrate adherence, this resin is expected to find application at a film thickness of at least 2,000 Å. Since alcoholic groups are used as soluble groups, however, this resin has the drawback of a low dissolution rate in overexposed areas where acid-eliminatable groups have been eliminated. For increasing the dissolution rate in overexposed areas, it is contemplated effective to add a polymer which generates carboxylic acid or hexafluoroalcohol upon acid elimination.

SUMMARY OF THE INVENTION

An object of the invention is to provide a resist composition, especially a chemical amplification resist composition, having a high transmittance to vacuum UV radiation of up to 300 nm, especially KrF (248 nm), ArF (193 nm), $F_2$ (157 nm), $Kr_2$ (146 nm), KrAr (134 nm) and $Ar_2$ (126 nm) laser beams, as well as improved etching resistance. Another object is to provide a patterning process using the same.

The inventors have found that by blending a cyclic polymer having alcoholic groups as soluble groups and featuring high transparency as represented by the general formula (1) with a polymer having carboxyl or hexafluoroalcohol groups whose hydrogen atoms are replaced by acid labile groups and featuring an improved dissolution contrast, there is formulated a resist composition, especially a chemically amplified resist composition, capable of forming to a substantial thickness a patterned film having a very high transparency, a high dissolution contrast and a high aspect ratio.

In a first aspect, the present invention provides a resist composition comprising a polymer comprising recurring units of the general formula (1) and a polymer comprising recurring units of the general formula (2).

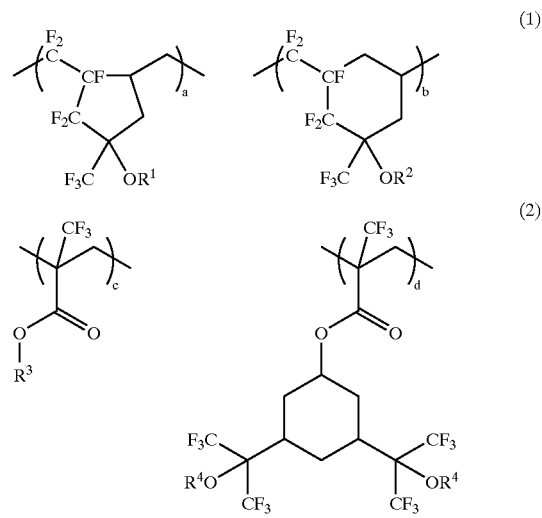

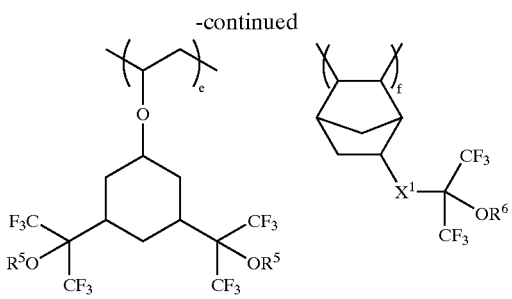

Herein $R^1$ and $R^2$ each are hydrogen or an acid labile group, letters a and b are numbers satisfying $0 \leq a \leq 1$, $0 \leq b \leq 1$ and $0.3 \leq a+b \leq 1$, $R^3$ is an acid labile group, $R^4$ and $R^5$ are each independently hydrogen, an alkyl group of 1 to 4 carbon atoms which may be substituted with a fluorine atom, cyano group or hydroxy group, or an acid labile group, $R^6$ is hydrogen, an alkyl group of 1 to 4 carbon atoms which may be substituted with a fluorine atom, cyano group or hydroxy group, or an acid labile group, $X^1$ is a single bond, methylene group or ethylene group, letters c, d, e and f are numbers satisfying $0 \leq c<0.8$, $0<d<0.8$, $0<c+d<0.8$, $0 \leq e<0.8$, $0 \leq f<0.8$, $0<e+f<0.8$, and $0.5 \leq c+d+e+f \leq 1$.

In a second aspect, the present invention provides a resist composition comprising a polymer comprising recurring units of the general formula (1) and a polymer comprising recurring units of the general formula (3).

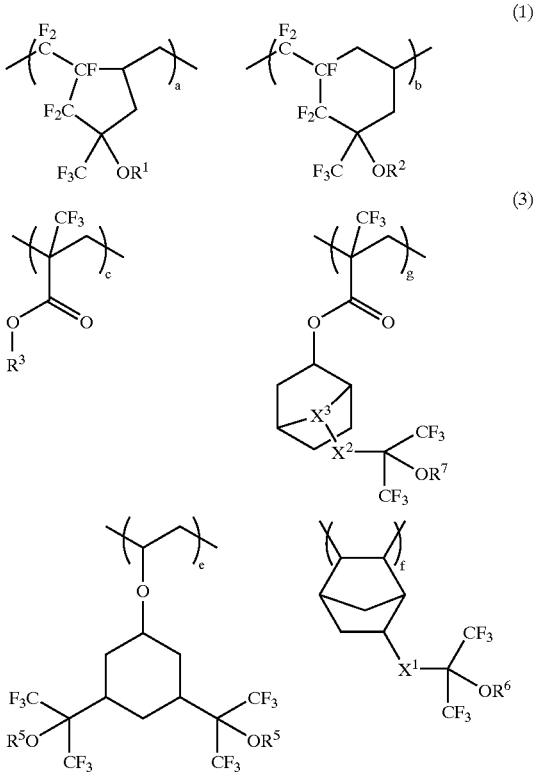

Herein $R^1$ to $R^3$, $R^5$, $R^6$, $X^1$, a and b are as defined above, $R^7$ is hydrogen, an alkyl group of 1 to 4 carbon atoms which may be substituted with a fluorine atom, cyano group or hydroxy group, or an acid labile group, $X^2$ is a single bond, methylene group or ethylene group, $X^3$ is a methylene group, ethylene group, oxygen atom or sulfur atom, letters c, g, e and f are numbers satisfying $0 \leq c<0.8$, $0<g<0.8$, $0<c+g<0.8$, $0 \leq e<0.8$, $0 \leq f<0.8$, $0<e+f<0.8$, and $0.5 \leq c+g+e+f \leq 1$.

In a third aspect, the present invention provides a chemically amplified positive resist composition comprising
(A) a blend of a polymer of formula (1) and a polymer of formula (2) or (3),
(B) an organic solvent,
(C) a photoacid generator, and optionally,
(D) a basic compound and/or
(E) a dissolution inhibitor.

In a fourth aspect, the present invention provides a process for forming a resist pattern comprising the steps of (1) applying the resist composition defined above onto a substrate to form a coating, (2) heat treating the coating and then exposing it to high-energy radiation having a wavelength of up to 300 nm through a photomask, and (3) optionally heat treating the exposed coating and developing it with a developer. The high-energy radiation is preferably in a wavelength band of 100 to 180 nm or 1 to 30 nm. Most often, the high-energy radiation is a KrF excimer laser beam, ArF excimer laser beam, $F_2$ laser beam, $Ar_2$ laser beam or soft x-ray.

The resist composition comprising a blend of a resin of formula (1) which is sensitive to high-energy radiation and highly transparent at a wavelength of up to 200 nm, and a resin of formula (2) or (3) which has an improved alkaline dissolution contrast as a base resin forms a resist film which is improved in transparency, alkali dissolution contrast and plasma etching resistance. These features of the inventive resist composition permit a finely defined pattern having sidewalls perpendicular to the substrate and a high aspect ratio to be easily be formed through $F_2$ laser exposure, making the resist ideal as a micropatterning material in VLSI fabrication.

DESCRIPTION OF THE PREFERRED EMBODIMENTS

Polymers

For improving the transmittance in proximity to 157 nm, reducing the number of carbonyl groups and/or carbon-to-carbon double bonds is contemplated to be one effective way. It was also found that introducing fluorine atoms into base polymers makes a great contribution to improved transmittance. In fact, poly(vinyl phenol) having fluorine introduced in its aromatic rings provides an improved transmittance (see JP-A 2001-146505). However, this base polymer was found to turn to be negative upon exposure to high-energy radiation from an $F_2$ laser, interfering with its use as a practical resist. In contrast, those polymers obtained by introducing fluorine into acrylic resins or polymers containing in their backbone an alicyclic compound originating from a norbornene derivative were found to minimize absorption and eliminate the negative turning problem.

The resist composition of the present invention uses as a base resin a blend of a polymer or high molecular weight compound comprising recurring units of the general formula (1) and another polymer or high molecular weight compound comprising recurring units of the general formula (2) or (3).

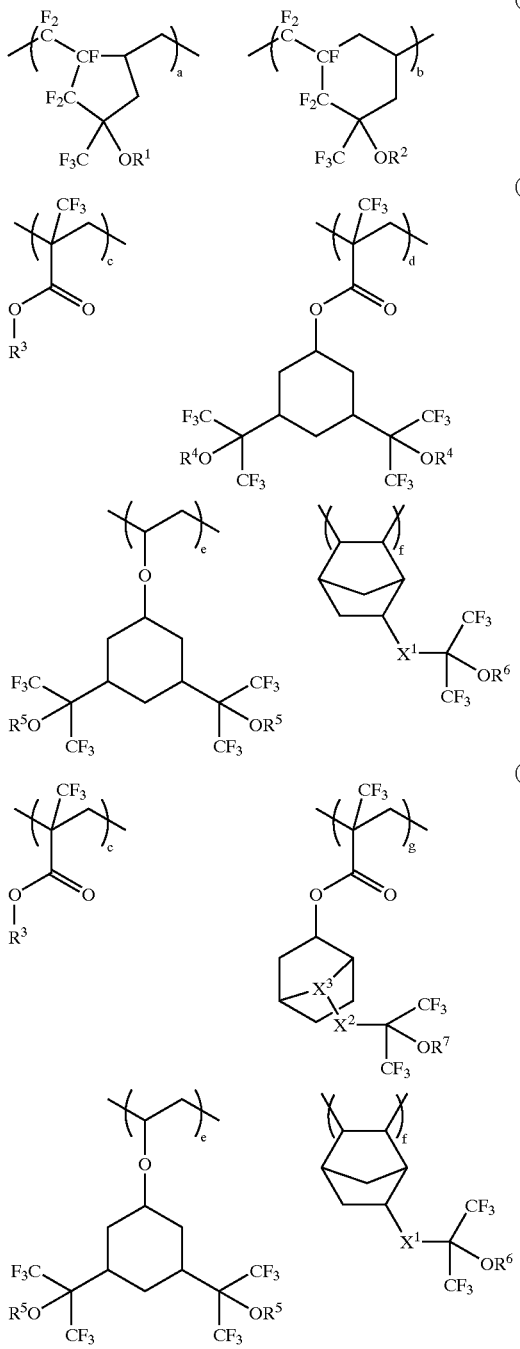

Herein $R^1$ and $R^2$ each are hydrogen or an acid labile group; letters a and b are numbers satisfying $0 \leq a \leq 1$, $0 \leq b \leq 1$ and $0.3 \leq a+b \leq 1$; $R^3$ is an acid labile group; $R^4$ and $R^5$ are each independently hydrogen, an alkyl group of 1 to 4 carbon atoms which may be substituted with a fluorine atom, cyano group or hydroxy group, or an acid labile group; $R^6$ is hydrogen, an alkyl group of 1 to 4 carbon atoms which may be substituted with a fluorine atom, cyano group or hydroxy group, or an acid labile group; $X^1$ is a single bond, methylene group or ethylene group; letters c, d, e and f are numbers satisfying $0 \leq c < 0.8$, $0 < d < 0.8$, $0 < c+d < 0.8$, $0 \leq e < 0.8$, $0 \leq f < 0.8$, $0 < e+f < 0.8$, and $0.5 \leq c+d+e+f \leq 1$; $R^7$ is hydrogen, an alkyl group of 1 to 4 carbon atoms which may be substituted with a fluorine atom, cyano group or hydroxy group, or an acid labile group; $X^2$ is a single bond, methylene group or ethylene group; $X^3$ is a methylene group, ethylene group, oxygen atom or sulfur atom; letters c, g, e and f are numbers satisfying $0 \leq c < 0.8$, $0 < g < 0.8$, $0 < c+g < 0.8$, $0 \leq e < 0.8$, $0 \leq f < 0.8$, $0 < e+f < 0.8$, and $0.5 \leq c+g+e+f \leq 1$.

The polymer represented by formula (1) is highly transparent because of a high fluorine content and the absence of carbonyl and phenyl groups which cause absorption.

In formula (1), a and b are numbers in the range: $0 \leq a \leq 1$ and $0 \leq b \leq 1$, and a proportion of a and b varies with polymerization conditions. Preferably, both a and b are in a range from 0.2 to 0.8. The sum of a and b preferably satisfies $0.3 \leq a+b \leq 1$, and especially $0.4 \leq a+b \leq 1$. Each of $R^1$ and $R^2$ is hydrogen or an acid labile group. The degree of substitution of acid labile groups is preferably 3 to 50 mol %, especially 5 to 40 mol %, based on the total of $R^1$ and $R^2$.

The polymer represented by formula (1) is obtained by polymerizing a monomer as shown below.

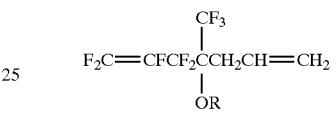

Herein R may be the same as $R^1$ and $R^2$ or different therefrom, and is preferably a carbonylmethyl group when different. In the latter case, after polymerization, the carbonylmethyl group may be converted through alkaline hydrolysis to a hydrogen atom, which is then replaced by an acid labile group.

The polymerization of the above monomer is radical polymerization and more specifically, ring-closing polymerization where polymerization proceeds while forming rings. During ring formation, 5- and 6-membered rings are formed. The 6-membered rings include units represented by formula (1) and optionally, recurring units having the general formula (4).

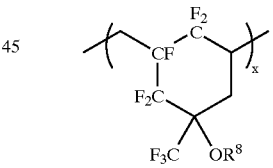

In formula (4), $R^8$ is hydrogen or an acid labile group as defined for $R^1$ and $R^2$, x is in the range of 0 to 0.4 (i.e., $0 \leq x \leq 0.4$), and preferably, a+b+x=1.

In formulae (2) and (3), the alkyl groups of 1 to 4 carbon atoms represented by $R^4$, $R^5$, $R^6$ and $R^7$ include methyl, ethyl, n-propyl, and isopropyl. The alkyl groups may be substituted with fluorine atoms, cyano groups or hydroxyl groups, and such examples include trifluoroethyl, cyanomethyl and hydroxymethyl.

In formulae (2) and (3), letters c, d, e, f and g are preferably numbers satisfying
$0 \leq c \leq 0.6$, especially $0 \leq c \leq 0.5$,
$0.2 \leq d \leq 0.75$, especially $0.3 \leq d \leq 0.7$,
$0.2 \leq c+d \leq 0.75$, especially $0.3 \leq c+d \leq 0.7$,
$0 \leq e \leq 0.75$, especially $0 \leq e \leq 0.7$,
$0 \leq f \leq 0.7$, especially $0 \leq f \leq 0.6$, $0.2 \leq e+f \leq 0.75$, especially $0.25 \leq e+f \leq 0.7$,
$0.2 \leq g \leq 0.75$, especially $0.3 \leq g \leq 0.7$, and
$0.2 \leq c+g \leq 0.75$, especially $0.3 \leq c+g \leq 0.7$.

The sums of $c+d+e+f$ and $c+g+e+f$ are:
$0.5 \leq c+d+e+f \leq 1$, preferably $0.6 \leq c+d+e+f \leq 1$, and
$0.5 \leq c+g+e+f \leq 1$, preferably $0.6 \leq c+g+e+f \leq 1$.

In case $c+d+e+f<1$ or $c+g+e+f<1$, the polymer contains additional units which may be derived from acrylic esters, methacrylic esters, vinyl ethers, norbornene and norbornadiene.

Preferably the polymers of the formulae (1), (2) and (3) have a weight average molecular weight of about 2,000 to about 50,000, and more preferably about 3,000 to about 40,000.

It is noted that $a+b+c=1$ means that in polymers comprising recurring units a, b and c, the total of recurring units a, b and c is 100 mol % based on the total of entire recurring units; and $a+b+c<1$ means that the total of recurring units a, b and c is less than 100 mol % based on the total of entire recurring units, indicating the inclusion of additional recurring units other than a, b and c.

The acid labile groups represented by $R^1$, $R^2$, $R^3$, $R^4$, $R^5$, $R^6$, $R^7$ and $R^8$, which may be the same or different, are selected from a variety of such groups, preferably from tertiary hydrocarbon groups represented by the following general formula (AL-1). Those groups having a cyclic structure are more effective for improving etching resistance. The cyclic structure may be either a monocyclic structure or a bridged cyclic structure which is effective for imparting more etching resistance. An acid-eliminatable group having a cyclic structure introduced therein is more elimination reactive and effective for improving contrast, that is, the gamma of dissolution.

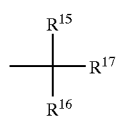

(AL-1)

Herein $R^{15}$, $R^{16}$ and $R^{17}$ are each independently a straight, branched or cyclic hydrocarbon group of 1 to 20 carbon atoms while a bridged cyclic hydrocarbon group is also acceptable.

Examples of $R^{15}$, $R^{16}$ and $R^{17}$ include methyl, ethyl, n-propyl, isopropyl, t-butyl, cyclohexyl, cyclopentyl, norbornyl, adamantyl and menthyl. Alternatively, a pair of $R^{15}$ and $R^{16}$, $R^{15}$ and $R^{17}$, or $R^{16}$ and $R^{17}$ may bond together to form a $C_3$–$C_{20}$ ring, especially $C_4$–$C_{12}$ ring with the carbon atom to which they are attached.

Illustrative examples of suitable tertiary hydrocarbon groups of formula (AL-1) are given below.

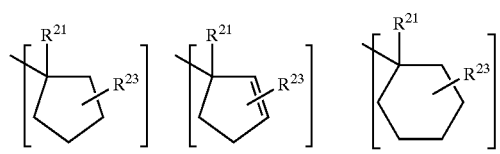

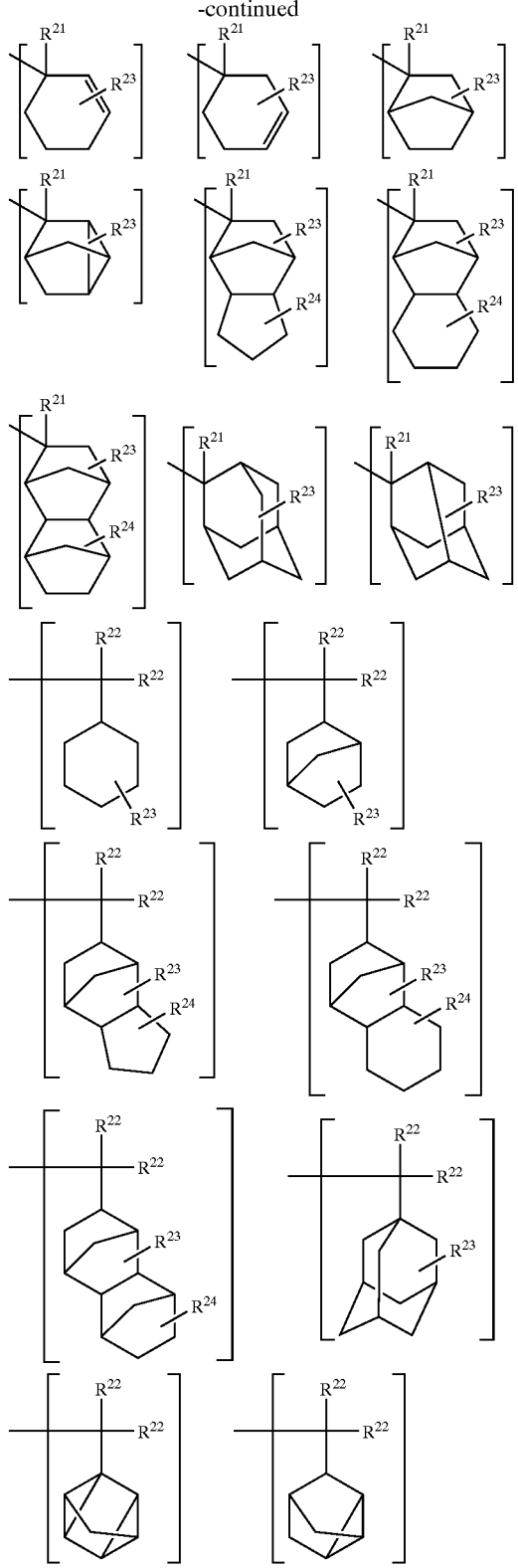

-continued

Herein, each of $R^{21}$ and $R^{22}$ is a monovalent hydrocarbon group of 1 to 6 carbon atoms which may contain a hetero atom. The hetero atom may be an oxygen atom, sulfur atom or nitrogen atom, and be contained or intervene in the form of —OH, —OR$^{25}$, —O—, —S—, —S(=O)—, —NH$_2$, —NHR$^{25}$, —N(R$^{25}$)$_2$, —NH— or —NR$^{25}$— wherein R$^{25}$ is a straight, branched or cyclic C$_1$–C$_{10}$ alkyl group. Illustrative examples of R$^{21}$ and R$^{22}$ include methyl, ethyl, propyl, isopropyl, n-butyl, sec-butyl, n-pentyl, n-hexyl, cyclopropyl, cyclopropylmethyl, cyclobutyl, cyclopentyl and cyclohexyl.

Each of R$^{23}$ and R$^{24}$ is hydrogen, a straight, branched or cyclic alkyl group, hydroxyalkyl, alkoxyalkyl, alkoxy or alkoxyalkoxy group or the like. Illustrative examples include methyl, hydroxymethyl, ethyl, hydroxyethyl, propyl, isopropyl, n-butyl, sec-butyl, n-pentyl, n-hexyl, methoxy, methoxymethoxy, ethoxy, and tert-butoxy.

Also useful are acid labile groups of the following general formula (AL-10) and (AL-11).

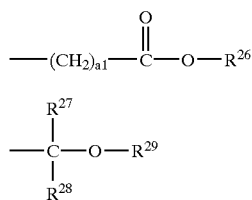

(AL-10)

(AL-11)

In formulae (AL-10) and (AL-11), each of R$^{26}$ and R$^{29}$ is a straight, branched or cyclic alkyl group of 1 to 20 carbon atoms which may contain a hetero atom such as oxygen, sulfur, nitrogen or fluorine. Each of R$^{27}$ and R$^{28}$ is hydrogen or a straight, branched or cyclic alkyl group of 1 to 20 carbon atoms which may contain a hetero atom such as oxygen, sulfur, nitrogen or fluorine. The subscript a1 is an integer of 0 to 10. A pair of R$^{27}$ and R$^{28}$, R$^{27}$ and R$^{29}$, or R$^{28}$ and R$^{29}$ may bond together to form a ring of 3 to 20 carbon atoms with the carbon and oxygen atoms to which they are attached.

Illustrative examples of the compound of formula (AL-10) include tert-butoxycarbonyl, tert-butoxycarbonylmethyl, tert-amyloxycarbonyl, tert-amyloxycarbonylmethyl, 1-ethoxyethoxycarbonylmethyl, 2-tetrahydropyranyloxycarbonylmethyl, and 2-tetrahydrofuranyloxycarbonylmethyl as well as substituent groups of the following general formulae (AL-10)-1 through (AL-10)-9.

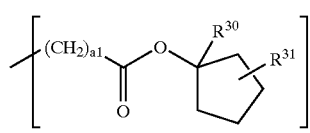

(AL-10)-1

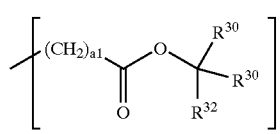

(AL-10)-2

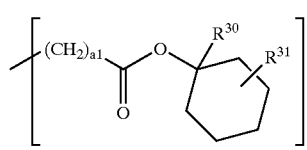

(AL-10)-3

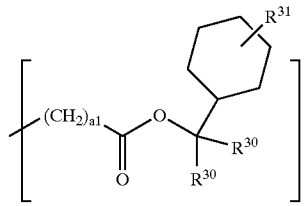

(AL-10)-4

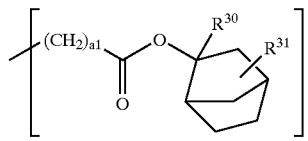

(AL-10)-5

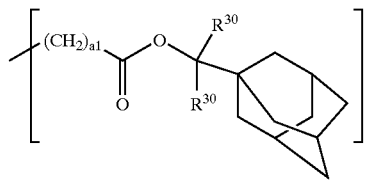

(AL-10)-6

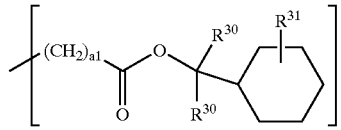

(AL-10)-7

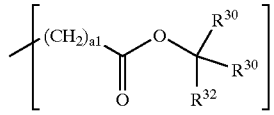

(AL-10)-8

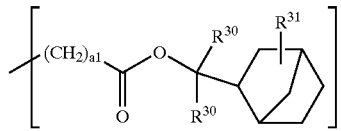

(AL-10)-9

In formulae (AL-10)-1 through (AL-10)-9, R$^{30}$ which may be the same or different is a straight, branched or cyclic C$_1$–C$_8$ alkyl group or a C$_6$–C$_{20}$ aryl or aralkyl group; R$^{31}$ is hydrogen or a straight, branched or cyclic C$_1$–C$_{20}$ alkyl group; and R$^{32}$ is a straight, branched or cyclic C$_2$–C$_{20}$ alkyl group or a C$_6$–C$_{20}$ aryl or aralkyl group.

Illustrative examples of the acetal compound of formula (AL-11) include those of the following formulae (AL-11)-1 through (AL-11)-23.

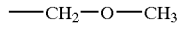 (AL-11)-1

 (AL-11)-2

 (AL-11)-3

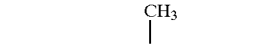 (AL-11)-4

 (AL-11)-5

-continued (AL-11)-6 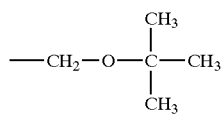

(AL-11)-7 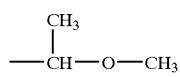

(AL-11)-8 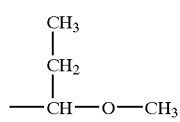

(AL-11)-9 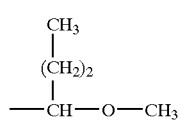

(AL-11)-10 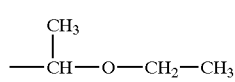

(AL-11)-11 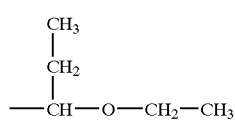

(AL-11)-12 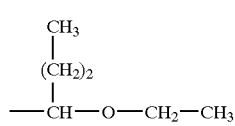

(AL-11)-13 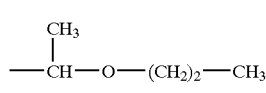

(AL-11)-14 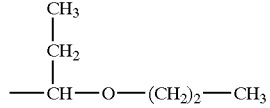

(AL-11)-15 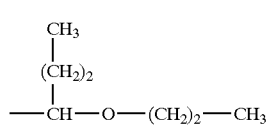

(AL-11)-16 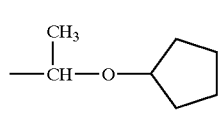

(AL-11)-17 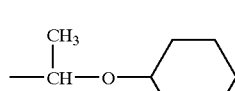

(AL-11)-18 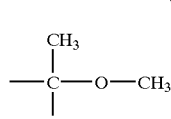

(AL-11)-19 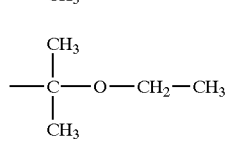

(AL-11)-20 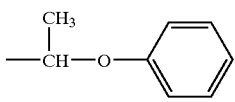

(AL-11)-21 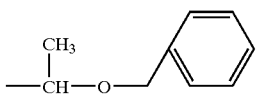

(AL-11)-22 

(AL-11)-23 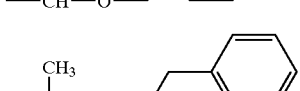

In an alternative embodiment, the polymer or base resin may be crosslinked within the molecule or between molecules with an acid labile group of the general formula (AL-11a) or (AL-11b).

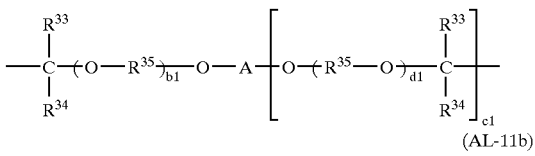

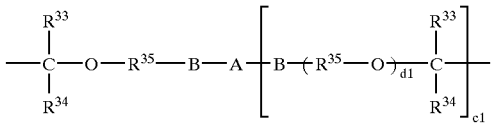

Herein $R^{33}$ and $R^{34}$ each are hydrogen or a straight, branched or cyclic $C_1$–$C_8$ alkyl group, or $R^{33}$ and $R^{34}$, taken together, may form a ring, and $R^{33}$ and $R^{34}$ are straight or branched $C_1$–$C_8$ alkylene groups when they form a ring; $R^{35}$ is a straight, branched or cyclic $C_1$–$C_{10}$ alkylene group; the subscripts b1 and d1 are 0 or integers of 1 to 10, and preferably 0 or integers of 1 to 5; c1 is an integer of 1 to 7; "A" is a (c1+1)-valent aliphatic or alicyclic saturated hydrocarbon group, aromatic hydrocarbon group or heterocyclic group having 1 to 50 carbon atoms, which may be separated by a hetero atom or in which some of the hydrogen atoms attached to carbon atoms may be substituted with hydroxyl, carboxyl, carbonyl or fluorine; and B is —CO—O—, —NHCO—O— or —NHCONH—.

Preferably, "A" is selected from di- to tetra-valent straight, branched or cyclic alkylene groups of 1 to 20 carbon atoms, alkyltriyl groups, alkyltetrayl groups and arylene groups of 6 to 30 carbon atoms, which may be separated by a hetero atom and in which some of the hydrogen atoms attached to carbon atoms may be substituted with hydroxyl, carboxyl or acyl groups or halogen atoms. The subscript c1 is preferably an integer of 1 to 3.

The crosslinking acetal groups of formulae (AL-11a) and (AL-11b) are exemplified by the following formulae (AL-11)-24 through (AL-11)-31.

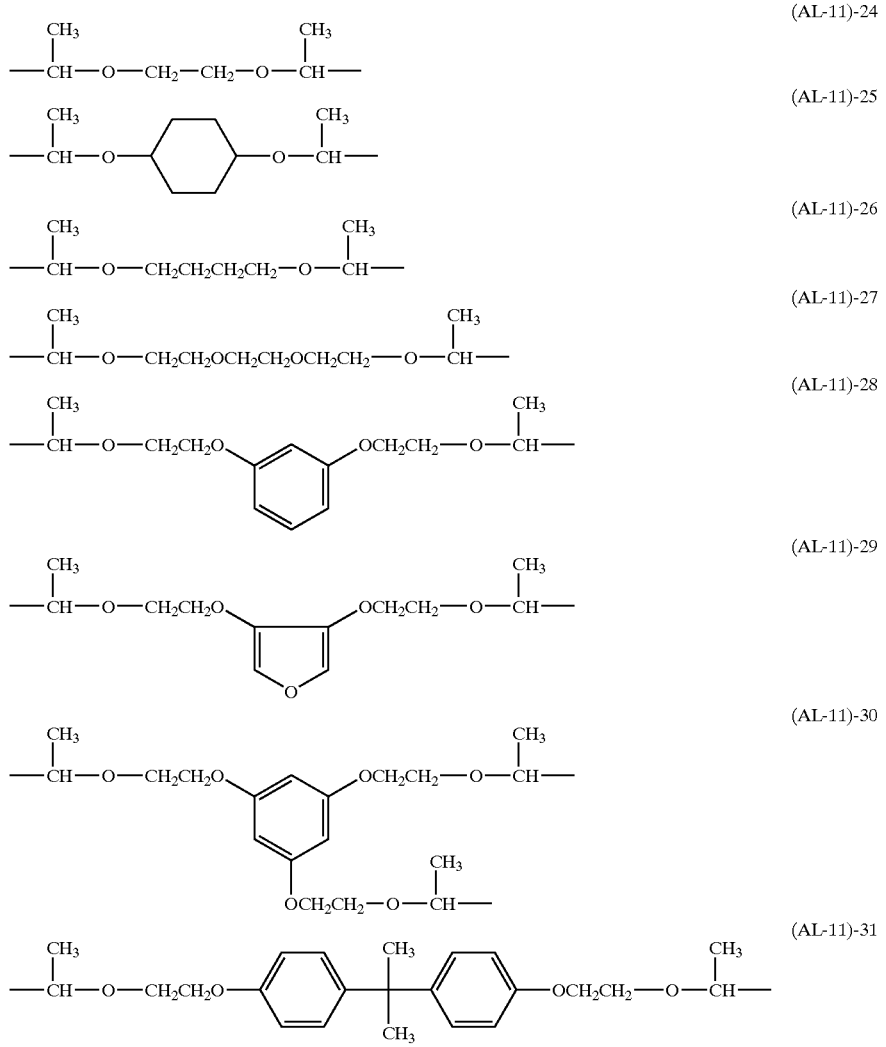

The polymer comprising recurring units of formula (1) and the polymer comprising recurring units of formula (2) or (3) are preferably blended in such a weight ratio that 5 to 200 parts by weight, especially 7 to 100 parts by weight of the polymer of formula (2) or (3) is present per 100 parts by weight of the polymer of formula (1). On this basis, less than 5 parts of the polymer of formula (2) or (3) may achieve less the dissolution contrast enhancing effect whereas more than 200 parts of the polymer of formula (2) or (3) may detract from transparency. Each of the polymers used in blend may be a single polymer or a mixture of two or more polymers.

Resist Composition

As long as the polymer blend of the invention is used as a base resin, the resist composition of the invention may be prepared using well-known components. In a preferred embodiment, the chemically amplified positive resist composition is defined as comprising (A) the above-described polymer blend as a base resin, (B) an organic solvent, and (C) a photoacid generator. In the resist composition, there may be further formulated (D) a basic compound and/or (E) a dissolution inhibitor.

Component (B)

The organic solvent used as component (B) in the invention may be any organic solvent in which the base resin, photoacid generator, and other components are soluble. Illustrative, non-limiting, examples of the organic solvent include ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Also useful are fluorinated organic solvents. Examples include 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4- difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, sec-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro-2,5-dimethyl-3,6-dioxane anionic acid methyl ester, 2H-perfluoro-5-methyl-3,6-dioxanonane, 1H,1H,2H,3H,3H-perfluoronanone-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, and 1,1,1-trifluoro-5,5-dimethyl-2,4-hexanedione.

These solvents may be used alone or in combinations of two or more thereof. Of the above organic solvents, preferred are diethylene glycol dimethyl ether and 1-ethoxy-2-propanol, in which the photoacid generator is most soluble, and propylene glycol monomethyl ether acetate which is safe, and mixtures thereof.

The solvent is preferably used in an amount of about 300 to 10,000 parts by weight, more preferably about 500 to 5,000 parts by weight per 100 parts by weight of the base resin.

Component (C)

Suitable examples of the photoacid generator (C) include onium salts, diazomethane derivatives, glyoxime derivatives, β-ketosulfone derivatives, disulfone derivatives, nitrobenzylsulfonate derivatives, sulfonic acid ester derivatives, and imidoyl sulfonate derivatives.

The onium salts used as the photoacid generator are of the formula (PAG1).

$(R^{51})_iM^+K^-$                                             (PAG1)

In the formula, $R^{51}$ is a straight, branched or cyclic alkyl of 1 to 12 carbon atoms, an aryl of 6 to 20 carbon atoms, or an aralkyl of 7 to 12 carbon atoms; $M^+$ is iodonium or sulfonium; $K^-$ is a non-nucleophilic counter-ion; and the letter i is 2 or 3.

Illustrative examples of alkyl groups represented by $R^{51}$ include methyl, ethyl, propyl, butyl, pentyl, 2-oxocyclopentyl, norbornyl, and adamantyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tert-butoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary aralkyl groups include benzyl and phenethyl. Examples of the non-nucleophilic counter-ion represented by $K^-$ include halide ions such as chloride and bromide; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; and alkylsulfonate ions such as mesylate and butanesulfonate.

Illustrative examples of the onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl) sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocyclohexyl)sulfonium trifluoromethanesulfonate, ethylenebis[methyl(2-oxocyclopentyl)sulfonium trifluoromethanesulfonate], and 1,2'-naphthylcarbonylmethyltetrahydrothiophenium triflate.

The diazomethane derivatives used as the photoacid generator are of the formula (PAG2).

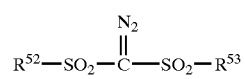

(PAG2)

In the formula, $R^{52}$ and $R^{53}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms.

Illustrative examples of alkyl groups represented by $R^{52}$ and $R^{53}$ include methyl, ethyl, propyl, butyl, amyl, cyclopentyl, cyclohexyl, norbornyl, and adamantyl. Exemplary halogenated alkyl groups include trifluoromethyl, 2,2,2-trifluoroethyl, 2,2,2-trichloroethyl, and nonafluorobutyl. Exemplary aryl groups include phenyl; alkoxyphenyl groups such as p-methoxyphenyl, m-methoxyphenyl, o-methoxyphenyl, ethoxyphenyl, p-tert-butoxyphenyl, and m-tertbutoxyphenyl; and alkylphenyl groups such as 2-methylphenyl, 3-methylphenyl, 4-methylphenyl, ethylphenyl, 4-tert-butylphenyl, 4-butylphenyl, and dimethylphenyl. Exemplary halogenated aryl groups include fluorophenyl, chlorophenyl, and 1,2,3,4,5-pentafluorophenyl. Exemplary aralkyl groups include benzyl and phenethyl.

Examples of the diazomethane derivatives include bis(benzenesulfonyl)diazomethane, bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, bis(tert-butylsulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butylsulfonyl)diazomethane, 1-cyclohexylsulfonyl-1-(tert-amylsulfonyl)diazomethane, and 1-tert-amylsulfonyl-1-(tert-butylsulfonyl)diazomethane.

The glyoxime derivatives used as the photoacid generator are of the formula (PAG3).

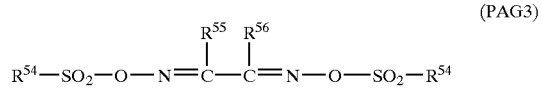

(PAG3)

In the formula, $R^{54}$ to $R^{56}$ are straight, branched or cyclic alkyl or halogenated alkyl groups of 1 to 12 carbon atoms, aryl or halogenated aryl groups of 6 to 12 carbon atoms, or aralkyl groups of 7 to 12 carbon atoms. $R^{55}$ and $R^{56}$ may together form a cyclic structure with the proviso that if they form a cyclic structure, each is a straight or branched alkylene group of 1 to 6 carbon atoms.

The alkyl, halogenated alkyl, aryl, halogenated aryl, and aralkyl groups represented by $R^{54}$ to $R^{56}$ are exemplified by the same groups as mentioned above for $R^{52}$ and $R^{53}$. Examples of alkylene groups represented by $R^{55}$ and $R^{56}$ include methylene, ethylene, propylene, butylene, and hexylene.

Examples of the glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime, bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenzenesulfonyl)-α-dimethylglyoxime, bis-O-(xylenesulfonyl)-α-dimethylglyoxime, and bis-O-(camphorsulfonyl)-α-dimethylglyoxime.

Other useful photoacid generators include β-ketosulfone derivatives such as 2-cyclohexylcarbonyl-2-(p-toluenesulfonyl)propane and 2-isopropylcarbonyl-2-(p-toluenesulfonyl)propane; disulfone derivatives such as diphenyl disulfone and dicyclohexyl disulfone; nitrobenzyl sulfonate derivatives such as 2,6-dinitrobenzyl p-toluenesulfonate and 2,4-dinitrobenzyl p-toluenesulfonate; sulfonic acid ester derivatives such as 1,2,3-tris(methanesulfonyloxy)benzene, 1,2,3-tris(trifluoromethanesulfonyloxy)benzene, and 1,2,3-tris(p-toluenesulfonyloxy)benzene; and imidoyl sulfonate derivatives such as phthalimidoyl triflate, phthalimidoyl tosylate, 5-norbornene-2,3-dicarboxyimidoyl triflate, 5-norbornene-2,3-dicarboxyimidoyl tosylate, and 5-norbornene-2,3-dicarboxyimidoyl n-butyltriflate.

Preferred among these photoacid generators are onium salts such as triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, (p-tert-butoxyphenyl)diphenylsulfonium p-toluenesulfonate, tris(p-tert-butoxyphenyl)sulfonium p-toluenesulfonate, trinaphthylsulfonium trifluoromethanesulfonate, cyclohexylmethyl(2-oxocyclohexyl)sulfonium trifluoromethanesulfonate, (2-norbornyl)methyl(2-oxocylohexyl)sulfonium trifluoromethanesulfonate, and 1,2'-naphthylcarbonylmethyltetrahydrothiophenium triflate; diazomethane derivatives such as bis(benzenesulfonyl)diazomethane, bis(p-toluenesulfonyl)diazomethane, bis(cyclohexylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethane, and bis(tert-butylsulfonyl)diazomethane; and glyoxime derivatives such as bis-O-(p-toluenesulfonyl)-α-dimethylglyoxime and bis-O-(n-butanesulfonyl)-α-dimethylglyoxime. These photoacid generators may be used singly or in combinations of two or more thereof. Onium salts are effective for improving rectangularity, while diazomethane derivatives and glyoxime derivatives are effective for reducing standing waves. The combination of an onium salt with a diazomethane or a glyoxime derivative allows for fine adjustment of the profile.

The photoacid generator is preferably added in an amount of about 0.2 to 15 parts by weight per 100 parts by weight of the base resin. At less than 0.2 part, the amount of acid generated during exposure may be too small and the sensitivity and resolution be poor, whereas the addition of more than 15 parts may lower the transmittance of the resist and result in a poor resolution.

Component (D)

The basic compound used as component (D) is preferably a compound capable of suppressing the rate of diffusion when the acid generated by the photoacid generator diffuses within the resist film. The inclusion of this type of basic compound holds down the rate of acid diffusion within the resist film, resulting in better resolution. In addition, it suppresses changes in sensitivity following exposure, thus reducing substrate and environment dependence, as well as improving the exposure latitude and the pattern profile. See JP-A 5-232706, 5-249683, 5-158239, 5-249662, 5-257282, 5-289322, and 5-289340.

Examples of suitable basic compounds include ammonia, primary, secondary, and tertiary aliphatic amines, mixed amines, aromatic amines, heterocyclic amines, carboxyl group-bearing nitrogenous compounds, sulfonyl group-bearing nitrogenous compounds, hydroxyl group-bearing nitrogenous compounds, hydroxyphenyl group-bearing nitrogenous compounds, alcoholic nitrogenous compounds, amide derivatives, and imide derivatives.

Examples of suitable primary aliphatic amines include methylamine, ethylamine, n-propylamine, isopropylamine, n-butylamine, iso-butylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, di-iso-propylamine, di-n-butylamine, di-iso-butylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, tri-iso-propylamine, tri-n-butylamine, tri-iso-butylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine.

Examples of suitable aromatic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl) amine, methyldiphenylamine, triphenylamine, phenylenediamine, naphthylamine, and diaminonaphthalene.

Examples of suitable heterocyclic amines include pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl) pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 1-methyl-2-pyridine, 4-pyrrolidinopyridine, 1-methyl-4-phenylpyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable carboxyl group-bearing nitrogenous compounds include aminobenzoic acid, indolecarboxylic acid, nicotinic acid, and amino acid derivatives (e.g. alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine).

Examples of suitable sulfonyl group-bearing nitrogenous compounds include 3-pyridinesulfonic acid and pyridinium p-toluenesulfonate.

Examples of suitable hydroxyl group-bearing nitrogenous compounds, hydroxyphenyl group-bearing nitrogenous compounds, and alcoholic nitrogenous compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide.

Examples of suitable amide derivatives include formamide, N-methylformamide, N,N-dimethylformamide, acetamide, N-methylacetamide, N,N-dimethylacetamide, propionamide, and benzamide. Suitable imide derivatives include phthalimide, succinimide, and maleimide.

In addition, basic compounds of the following general formula (B)-1 may also be included alone or in admixture.

$$N(X)_n(Y)_{3-n} \qquad (B)\text{-}1$$

In the formula, n is equal to 1, 2 or 3; the side chain Y is independently hydrogen or a straight, branched or cyclic $C_1$–$C_{20}$ alkyl group which may contain a hydroxyl group or ether; and the side chain X is independently selected from groups of the following general formulas (X)-1 to (X)-3, and two or three X's may bond together to form a ring.

$$-\!\!\!+\!R^{300}-O-R^{301}] \qquad (X)\text{-}1$$

$$-\!\!\!+\!R^{302}-O-R^{303}\overset{O}{\underset{\|}{-}}R^{304}] \qquad (X)\text{-}2$$

$$-\!\!\!+\!R^{305}\overset{O}{\underset{\|}{-}}-O-R^{306}] \qquad (X)\text{-}3$$

In the formulas, $R^{300}$, $R^{302}$ and $R^{305}$ are independently straight or branched alkylene groups of 1 to 4 carbon atoms; $R^{301}$ and $R^{304}$ are independently hydrogen or straight, branched or cyclic alkyl groups of 1 to 20 carbon atoms, which may contain one or more hydroxyl, ether, ester groups or lactone rings; $R^{303}$ is a single bond or a straight or branched alkylene group of 1 to 4 carbon atoms; and $R^{306}$ is a straight, branched or cyclic alkyl group of 1 to 20 carbon atoms which may contain one or more hydroxyl, ether, ester groups or lactone rings.

Illustrative examples of the compounds of formula (B)-1 include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxycarbonyl]ethylamine, N,N-bis(2-acetoxyethyl)-2-[(2-oxotetrahydrofuran-3-yl)oxycarbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, and β-(diethylamino)-δ-valerolactone.

Also useful are one or more of cyclic structure-bearing basic compounds having the following general formula (B)-2.

(B)-2

Herein X is as defined above, and $R^{307}$ is a straight or branched alkylene group of 2 to 20 carbon atoms which may contain one or more carbonyl, ether, ester or sulfide groups.

Illustrative examples of the cyclic structure-bearing basic compounds having formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy)methoxy]ethyl]morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl)propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Also, one or more of cyano-bearing basic compounds having the following general formulae (B)-3 to (B)-6 may be blended.

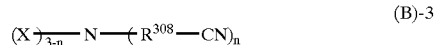

(B)-3

(B)-4

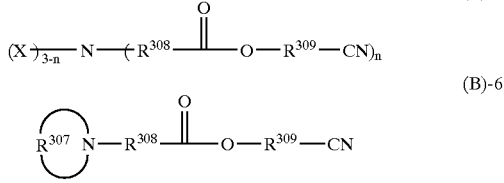

(B)-5

(B)-6

Herein, X, $R^{307}$ and n are as defined above, and $R^{308}$ and $R^{309}$ each are independently a straight or branched $C_1$–$C_4$ alkylene group.

Illustrative examples of the cyano-bearing basic compounds having formulae (B)-3 to (B)-6 include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropionitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-(2-(methoxymethoxy)ethyl)aminoacetonitrile, N-cyanomethyl-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl)aminoacetonitrile, N,N-bis(cyanomethyl)aminoacetonitrile, 1-pyrrolidinepropiononitrile, 1-piperidinepropiononitrile, 4-morpholinepropiononitrile, 1-pyrrolidineacetonitrile, 1-piperidineacetonitrile, 4-morpholineacetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidinepropionate, cyanomethyl 1-piperidinepropionate, cyanomethyl 4-morpholinepropionate, 2-cyanoethyl 1-pyrrolidinepropionate, 2-cyanoethyl 1-piperidinepropionate, and 2-cyanoethyl 4-morpholinepropionate.

The basic compound is preferably formulated in an amount of 0.001 to 2 parts, and especially 0.01 to 1 part by weight, per 100 parts by weight of the entire base resin. Less than 0.001 part of the basic compound may fail to achieve the desired effects thereof, while the use of more than 2 parts would result in too low a sensitivity.

Component (E)

The dissolution inhibitor (E) is a compound with a molecular weight of up to 3,000 which changes its solubility in an alkaline developer under the action of an acid. Typically, a compound obtained by partially or entirely substituting acid labile groups for hydroxyl groups on a phenol or carboxylic acid derivative having a molecular weight of up to 2,500 is added as the dissolution inhibitor. The acid labile groups are as exemplified above and may be the same as or different from those on the base polymers.

Examples of the phenol or carboxylic acid derivative having a molecular weight of up to 2,500 include 4,4'-(1-methylethylidene)bisphenol, (1,1'-biphenyl-4,4'-diol)-2,2'-methylenebis(4-methylphenol), 4,4-bis(4'-hydroxyphenyl) valeric acid, tris(4-hydroxyphenyl)methane, 1,1,1-tris(4'-hydroxyphenyl)ethane, 1,1,2-tris(4'-hydroxyphenyl)ethane, phenolphthalein, thimolphthalein, 3,3'-difluoro[(1,1'-biphenyl)-4,4'-diol], 3,3',5,5'-tetrafluoro[(1,1'-biphenyl)-4,4'-diol], 4,4'-[2,2,2-trifluoro-1-(trifluoromethyl)ethylidene]bisphenol, 4,4'-methylenebis(2-fluorophenol), 2,2'-methylenebis(4-fluorophenol), 4,4'-isopropylidenebis(2-fluorophenol), cyclohexylidenebis(2-fluorophenol), 4,4'-[(4-fluorophenyl)methylene]bis(2-fluorophenol), 4,4'-methylenebis(2,6-difluorophenol), 4,4'-(4-fluorophenyl)methylenebis(2,6-difluorophenol), 2,6-bis[(2-hydroxy-5-fluorophenyl)methyl]-4-fluorophenol, 2,6-bis[(4-hydroxy-3-fluorophenyl)methyl]-4-fluorophenol, and 2,4-bis[(3-hydroxy-4-hydroxyphenyl)methyl]-6-methylphenol.

The acid labile substituents are the same as described above.

Illustrative, non-limiting, examples of the dissolution inhibitors which are useful herein include 3,3',5,5'-tetrafluoro[(1,1'-biphenyl)-4,4'-di-t-butoxycarbonyl], 4,4'-[2,2,2-trifluoro-1-(trifluoromethyl)ethylidene]-bisphenol-4,4'-di-t-butoxycarbonyl, bis(4-(2'-tetrahydropyranyloxy)phenyl)methane, bis(4-(2'-tetrahydrofuranyloxy)phenyl)methane, bis(4-tert-butoxyphenyl)methane, bis(4-tert-butoxycarbonyloxyphenyl)methane, bis(4-tert-butoxycarbonylmethyloxyphenyl)methane, bis(4-(1'-ethoxyethoxy)phenyl)methane, bis(4-(1'-ethoxypropyloxy)phenyl)methane, 2,2-bis(4'-(2''-tetrahydropyranyloxy))propane, 2,2-bis(4'-(2''-tetrahydrofuranyloxy)phenyl)propane, 2,2-bis(4'-tert-butoxyphenyl)propane, 2,2-bis(4'-tert-butoxycarbonyloxyphenyl)propane, 2,2-bis(4-tert-butoxycarbonylmethyloxyphenyl)propane, 2,2-bis(4'-(1''-ethoxyethoxy)phenyl)propane, 2,2-bis(4'-(1''-ethoxypropyloxy)phenyl)propane, tert-butyl 4,4-bis(4'-(2''-tetrahydropyranyloxy)phenyl)-valerate, tert-butyl 4,4-bis(4'-(2''-tetrahydrofuranyloxy)phenyl)-valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)-valerate, tert-butyl 4,4-bis(4'-(1''-ethoxyethoxy)phenyl)valerate, tert-butyl 4,4-bis(4'-(1''-ethoxypropyloxy)phenyl)valerate, tris(4-(2'-tetrahydropyranyloxy)phenyl)methane, tris(4-(2'-tetrahydrofuranyloxy)phenyl)methane, tris(4-tert-butoxyphenyl)methane, tris(4-tert-butoxycarbonyloxyphenyl)methane, tris(4-tert-butoxycarbonyloxymethylphenyl)methane, tris(4-(1'-ethoxyethoxy)phenyl)methane, tris(4-(1'-ethoxypropyloxy)phenyl)methane, 1,1,2-tris(4'-(2''-tetrahydropyranyloxy)phenyl)ethane, 1,1,2-tris(4'-(2''-tetrahydrofuranyloxy)phenyl)ethane, 1,1,2-tris(4'-tert-butoxyphenyl)ethane, 1,1,2-tris(4'-tert-butoxycarbonyloxyphenyl)ethane, 1,1,2-tris(4'-tertbutoxycarbonylmethyloxyphenyl)ethane, 1,1,2-tris(4'-(1'-ethoxyethoxy)phenyl)ethane, 1,1,2-tris(4'-(1'-ethoxypropyloxy)phenyl)ethane, t-butyl 2-trifluoromethylbenzenecarboxylate, t-butyl 2-trifluoromethylcyclohexanecarboxylate, t-butyl decahydronaphthalene-2,6-dicarboxylate, t-butyl cholate, t-butyl deoxycholate, t-butyl adamantanecarboxylate, t-butyl adamantaneacetate, and tetra-t-butyl 1,1'-bicyclohexyl-3,3',4,4'-tetracarboxylate.

In the resist composition according to the invention, an appropriate amount of the dissolution inhibitor (E) is up to about 20 parts, and especially up to about 15 parts by weight per 100 parts by weight of the base resin in the composition.

The resist composition of the invention may include optional ingredients, typically a surfactant which is commonly used for improving the coating characteristics. Optional ingredients may be added in conventional amounts so long as this does not compromise the objects of the invention.

A nonionic surfactant is preferred, examples of which include perfluoroalkyl polyoxyethylene ethanols, fluorinated alkyl esters, perfluoroalkylamine oxides, perfluoroalkyl EO-addition products, and fluorinated organosiloxane compounds. Illustrative examples include Fluorad FC-430 and FC-431 from Sumitomo 3M Ltd., Surflon S-141 and S-145 from Asahi Glass Co., Ltd., Unidyne DS-401, DS-403, and DS-451 from Daikin Industries Ltd., Megaface F-8151 from Dainippon Ink & Chemicals, Inc., and X-70-092 and X-70-093 from Shin-Etsu Chemical Co., Ltd. Preferred surfactants include Fluorad FC-430 from Sumitomo 3M Ltd. and X-70-093 from Shin-Etsu Chemical Co., Ltd.

Pattern formation using the resist composition of the invention may be carried out by a known lithographic technique. For example, the resist composition may be applied onto a substrate such as a silicon wafer by spin coating or the like to form a resist film having a thickness of 0.1 to 1.0 µm, which is then pre-baked on a hot plate at 60 to 200° C. for 10 seconds to 10 minutes, and preferably at 80 to 150° C. for ½ to 5 minutes. A patterning mask having the desired pattern may then be placed over the resist film, and the film exposed through the mask to an electron beam or to high-energy radiation having a wavelength of up to 300 nm, such as deep-UV rays, excimer laser beams, or x-rays in a dose of about 1 to 200 mJ/cm², and preferably about 10 to 100 mJ/cm², then post-exposure baked (PEB) on a hot plate at 60 to 180° C. for 10 seconds to 5 minutes, and preferably at 80 to 150° C. for ½ to 3 minutes. Finally, development may be carried out using as the developer an aqueous alkali solution, such as 0.1 to 5%, and preferably 2 to 3%, tetramethylammonium hydroxide (TMAH), this being done by a conventional method such as dipping, puddling, or spraying for a period of 10 seconds to 3 minutes, and preferably 30 seconds to 2 minutes. These steps result in the formation of the desired pattern on the substrate. For suppressing the generation of standing waves from a narrow band excimer laser, an antireflection film may be provided between the substrate and the resist film or on the resist film. Of the various types of high-energy radiation that may be used, the resist composition of the invention is best suited to micro-pattern formation with, in particular, deep-UV rays having a wavelength of 254 to 120 nm, excimer laser beams, especially ArF excimer laser (193 nm), $Kr_2$ excimer laser (146 nm) or KrAr excimer laser (134 nm), laser beams such as $F_2$ laser (157 nm) or $Ar_2$ laser (126 nm), x-rays, or electron beams. Recommended is exposure to high-energy radiation in a wavelength band of 100 to 180 nm or 1 to 30 nm. The desired pattern may not be obtainable outside the upper and lower limits of the above range.

EXAMPLE

Examples of the invention are given below by way of illustration and not by way of limitation. The abbreviations used herein are AIBN for azobisisobutyronitrile, THF for tetrahydrofuran, GPC for gel permeation chromatography, NMR for nuclear magnetic resonance, Mw for weight average molecular weight, and Mn for number average molecular weight.

There were furnished Polymers 1 to 7 whose structural formula are shown later. Polymer 1 is FPR-120 by Asahi Glass Co., Ltd.

[Synthesis of Polymers 2 to 7]

Synthesis Example 1

Polymer 2: Copolymerization of Monomers 1, 2 and 3 (0.35:0.35:0.30)

A 300-ml flask was charged with 6.8 g of Monomer 1, 19.3 g of Monomer 2 and 9.5 g of Monomer 3, which were dissolved in 5.0 g of 1,4-dioxane. The system was thoroughly purged of oxygen, after which 0.41 g of an initiator AIBN was added. The flask was heated at 65° C., at which polymerization reaction was performed for 24 hours.

The resulting polymer was worked up by pouring the reaction mixture into 1 liter of hexane whereupon the polymer precipitated. The polymer collected was dissolved in THF and poured into 1 liter of hexane for precipitation again. This cycle was repeated twice. The polymer was separated and dried. There was obtained 16.9 g of a white polymer, which was found to have a Mw of 12,000 as measured by the light scattering method, and a dispersity (Mw/Mn) of 1.80 as determined from the GPC elution curve. On ¹H-NMR analysis, the polymer was found to have a polymerization composition of Monomer 1, Monomer 2 and Monomer 3 in a ratio of 0.35:0.35:0.30.

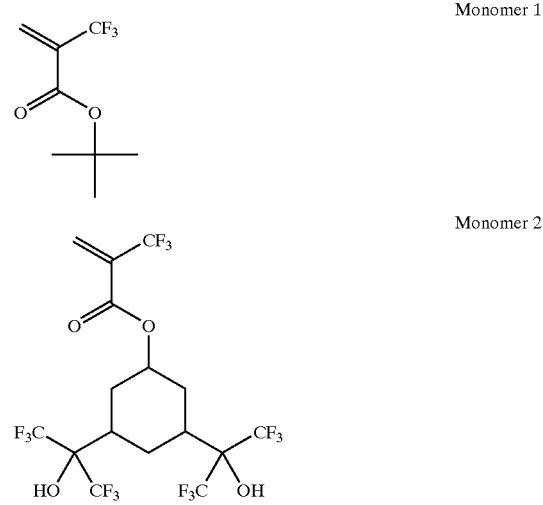

Monomer 1

Monomer 2

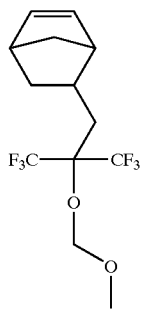

Monomer 3

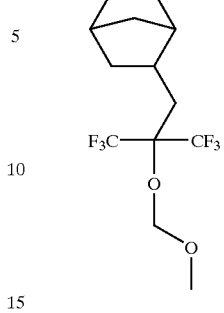

Monomer 3

Synthesis Example 2

Polymer 3: Copolymerization of Monomers 4, 2 and 3 (0.30:0.40:0.30)

A 300-ml flask was charged with 8.6 g of Monomer 4, 22.3 g of Monomer 2 and 9.5 g of Monomer 3, which were dissolved in 5.0 g of 1,4-dioxane. The system was thoroughly purged of oxygen, after which 0.41 g of an initiator AIBN was added. The flask was heated at 65° C., at which polymerization reaction was performed for 24 hours.

The resulting polymer was worked up by pouring the reaction mixture into 1 liter of hexane whereupon the polymer precipitated. The polymer collected was dissolved in THF and poured into 1 liter of hexane for precipitation again. This cycle was repeated twice. The polymer was separated and dried. There was obtained 18.1 g of a white polymer, which was found to have a Mw of 8,900 as measured by the light scattering method, and a dispersity (Mw/Mn) of 1.70 as determined from the GPC elution curve. On $^1$H-NMR analysis, the polymer was found to have a polymerization composition of Monomer 4, Monomer 2 and Monomer 3 in a ratio of 0.30:0.40:0.30.

Synthesis Example 3

Polymer 4: Copolymerization of Monomers 2 and 3 (0.70: 0.30) and Protection with Methoxymethoxy Groups (50%)

A 300-ml flask was charged with 44.3 g of Monomer 2 and 9.5 g of Monomer 3, which were dissolved in 5.0 g of 1,4-dioxane. The system was thoroughly purged of oxygen, after which 0.41 g of an initiator AIBN was added. The flask was heated at 65° C., at which polymerization reaction was performed for 24 hours.

The resulting polymer was worked up by pouring the reaction mixture into 1 liter of hexane whereupon the polymer precipitated. The polymer collected was dissolved in THF and poured into 1 liter of hexane for precipitation again. This cycle was repeated twice. The polymer was separated and dried. There was obtained 25.8 g of a white polymer, which was found to have a Mw of 10,100 as measured by the light scattering method, and a dispersity (Mw/Mn) of 1.72 as determined from the GPC elution curve. On $^1$H-NMR analysis, the polymer was found to have a polymerization composition of Monomer 2 and Monomer 3 in a ratio of 0.72:0.28.

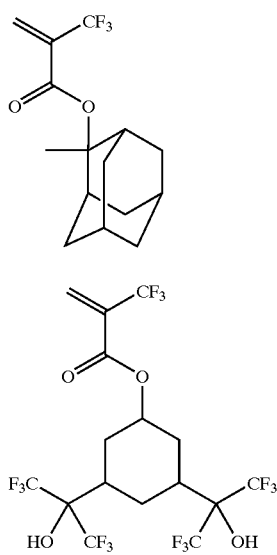

Monomer 4

Monomer 2

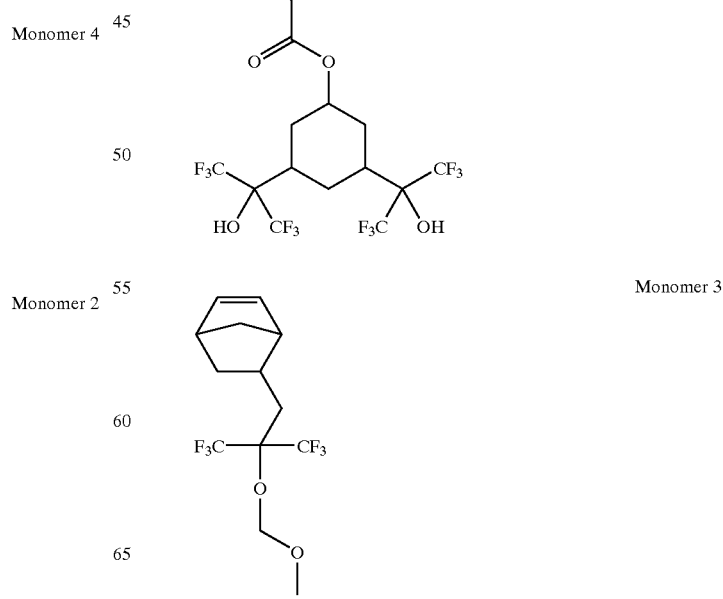

Monomer 2

Monomer 3

Next, 24 g of the thus obtained polymer was dissolved in 100 ml of THF. To the flask at room temperature, 3.5 g of methoxymethoxy chloride was added dropwise. Thereafter, the solution was heated at 60° C. and stirred for 20 hours.

The resulting polymer was worked up by pouring ether and water into the flask whereupon the organic layer separated. The organic layer was washed twice with saturated sodium chloride solution, concentrated, and poured into hexane whereupon the polymer precipitated. The polymer collected was dissolved in THF and poured into hexane for precipitation again, and this cycle was repeated twice. The polymer was separated and dried. There was obtained 26.1 g of a white polymer, which was found to have a Mw of 10,800 as measured by the light scattering method, and a dispersity (Mw/Mn) of 1.70 as determined from the GPC elution curve. On $^1$H-NMR analysis, the polymer was found to have a polymerization composition of Monomer 2 and Monomer 3 in a ratio of 0.72:0.28, and 50% of hydroxyl groups on hexafluoroalcohol in the polymer block of Monomer 2 were substituted with methoxymethoxy groups.

Synthesis Example 4

Polymer 5: Copolymerization of Monomers 2 and 3 (0.70: 0.30) and Protection with Methoxymethoxy Groups (25%) and Cyanomethyl Groups (25%)

A 300-ml flask was charged with 44.3 g of Monomer 2 and 9.5 g of Monomer 3, which were dissolved in 5.0 g of 1,4-dioxane. The system was thoroughly purged of oxygen, after which 0.41 g of an initiator AIBN was added. The flask was heated at 65 C, at which polymerization reaction was performed for 24 hours.

The resulting polymer was worked up by pouring the reaction mixture into 1 liter of hexane whereupon the polymer precipitated. The polymer collected was dissolved in THF and poured into 1 liter of hexane for precipitation again. This cycle was repeated twice. The polymer was separated and dried. There was obtained 25.8 g of a white polymer, which was found to have a Mw of 10,100 as measured by the light scattering method, and a dispersity (Mw/Mn) of 1.72 as determined from the GPC elution curve. On $^1$H-NMR analysis, the polymer was found to have a polymerization composition of Monomer 2 and Monomer 3 in a ratio of 0.72:0.28.

Monomer 2

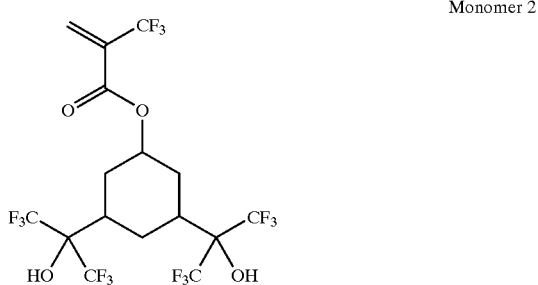

-continued

Monomer 3

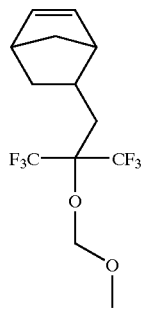

Next, 24 g of the thus obtained polymer was dissolved in 100 ml of THF. To the flask at room temperature, 2.1 g of methoxymethoxy chloride and 1.8 g of cyanomethyl chloride were added dropwise. Thereafter, the solution was heated at 60° C. and stirred for 20 hours.

The resulting polymer was worked up by pouring ether and water into the flask whereupon the organic layer separated. The organic layer was washed twice with saturated sodium chloride solution, concentrated, and poured into hexane whereupon the polymer precipitated. The polymer collected was dissolved in THF and poured into hexane for precipitation again, and this cycle was repeated twice. The polymer was separated and dried. There was obtained 25.1 g of a white polymer, which was found to have a Mw of 10,700 as measured by the light scattering method, and a dispersity (Mw/Mn) of 1.70 as determined from the GPC elution curve. On $^1$H-NMR analysis, the polymer was found to have a polymerization composition of Monomer 2 and Monomer 3 in a ratio of 0.72:0.28, and 24% and 26% of hydroxyl groups on hexafluoroalcohol in the polymer block of Monomer 2 were substituted with methoxymethoxy groups and cyanomethyl groups, respectively.

Synthesis Example 5

Polymer 6: Copolymerization of Monomers 5 and 6 (0.55: 0.45)

A 300-ml flask was charged with 29.5 g of Monomer 5 and 24.9 g of Monomer 6, which were dissolved in 5.0 g of 1,4-dioxane. The system was thoroughly purged of oxygen, after which 0.41 g of an initiator AIBN was added. The flask was heated at 65° C., at which polymerization reaction was performed for 24 hours.

The resulting polymer was worked up by pouring the reaction mixture into 1 liter of hexane whereupon the polymer precipitated. The polymer collected was dissolved in THF and poured into 1 liter of hexane for precipitation again. This cycle was repeated twice. The polymer was separated and dried. There was obtained 33.8 g of a white polymer, which was found to have a Mw of 15,000 as measured by the light scattering method, and a dispersity (Mw/Mn) of 1.80 as determined from the GPC elution curve. On $^1$H-NMR analysis, the polymer was found to have a polymerization composition of Monomer 5 and Monomer 6 in a ratio of 0.55:0.45.

Monomer 5

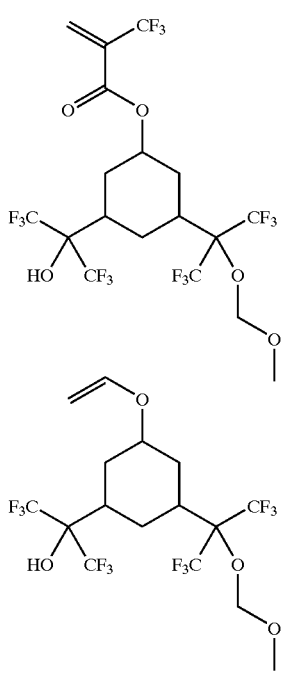

Monomer 6

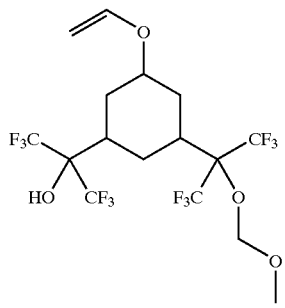

Synthesis Example 6

Polymer 7: Copolymerization of Monomers 7 and 6 (0.55:0.45)

A 300-ml flask was charged with 22.7 g of Monomer 7 and 22.9 g of Monomer 6, which were dissolved in 5.0 g of 1,4-dioxane. The system was thoroughly purged of oxygen, after which 0.41 g of an initiator AIBN was added. The flask was heated at 65° C., at which polymerization reaction was performed for 24 hours.

The resulting polymer was worked up by pouring the reaction mixture into 1 liter of hexane whereupon the polymer precipitated. The polymer collected was dissolved in THF and poured into 1 liter of hexane for precipitation again. This cycle was repeated twice. The polymer was separated and dried. There was obtained 31.1 g of a white polymer, which was found to have a Mw of 18,000 as measured by the light scattering method, and a dispersity (Mw/Mn) of 1.80 as determined from the GPC elution curve. On $^1$H-NMR analysis, the polymer was found to have a polymerization composition of Monomer 7 and Monomer 6 in a ratio of 0.55:0.45.

Monomer 7

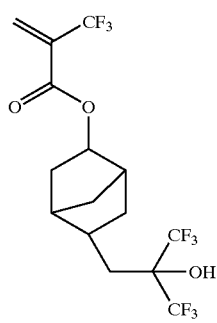

Polymers 1 to 7 have the following structural formulae.

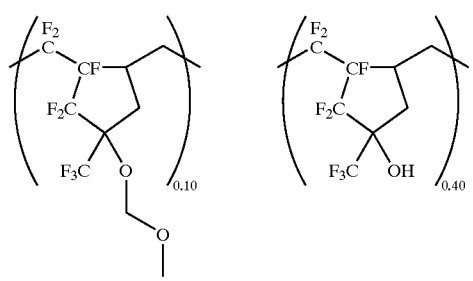

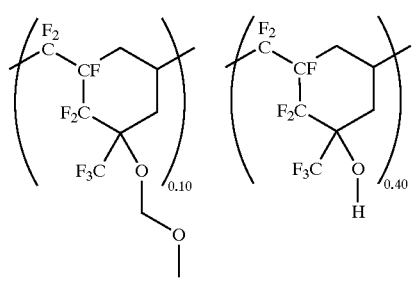

Polymer 1
Mw 21,000
Mw/Mn 2.40

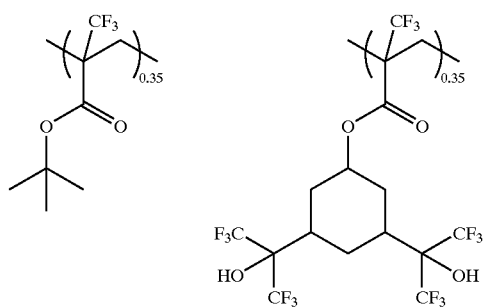

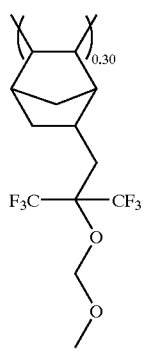

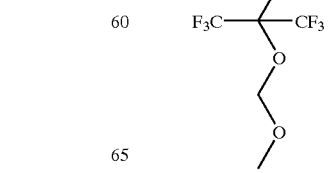

Polymer 2
Mw 12,000
Mw/Mn 1.80

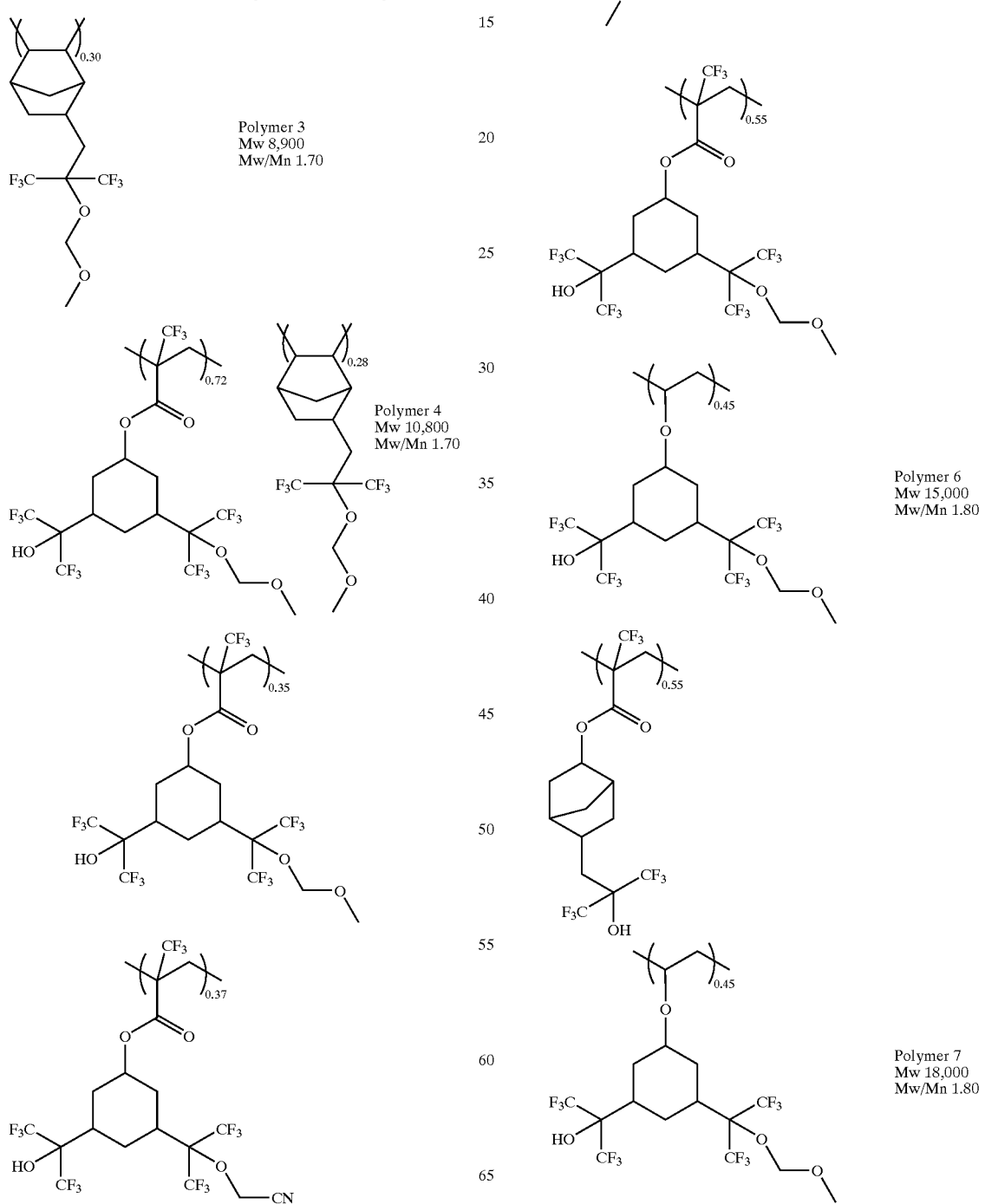

[Evaluation]

Polymer Transmittance Measurement

Polymers 1–7 and blends thereof (in a weight ratio as shown in Table 1) were determined for transmittance.

Each polymer or polymer blend, 1 g, was thoroughly dissolved in 20 g of propylene glycol monomethyl ether acetate (PGMEA), and passed through a 0.2-μm filter, obtaining a polymer solution. The polymer solution was spin coated onto a $MgF_2$ substrate and baked on a hot plate at 100° C. for 90 seconds, forming a polymer film of 100 nm thick on the substrate. Using a vacuum ultraviolet spectrometer (VUV-200S by Nihon Bunko K.K.), the polymer film was measured for transmittance at 248 nm, 193 nm and 157 nm. The results are shown in Table 1.

TABLE 1

| Polymer blend | Transmittance (%) | | |
|---|---|---|---|
| (weight ratio) | 248 nm | 193 nm | 157 nm |
| Polymer 1 + Polymer 2 (8:2) | 93 | 91 | 72 |
| Polymer 1 + Polymer 2 (7:3) | 93 | 90 | 70 |
| Polymer 1 + Polymer 3 (8:2) | 92 | 90 | 66 |
| Polymer 1 + Polymer 4 (8:2) | 92 | 42 | 78 |
| Polymer 1 + Polymer 5 (8:2) | 92 | 88 | 75 |
| Polymer 1 + Polymer 6 (8:2) | 92 | 92 | 82 |
| Polymer 1 + Polymer 7 (8:2) | 92 | 93 | 80 |
| Polymer 1 | 93 | 92 | 87 |
| Polymer 2 | 90 | 90 | 62 |
| Polymer 3 | 92 | 89 | 55 |
| Polymer 4 | 93 | 90 | 64 |
| Polymer 5 | 90 | 91 | 65 |
| Polymer 6 | 93 | 92 | 73 |
| Polymer 7 | 91 | 92 | 72 |

Resist Preparation and Exposure

Resist solutions were prepared in a conventional manner by formulating the polymer or polymer blend, photoacid generator (PAG i or PAG ii), basic compound, dissolution inhibitor (DRI1) and solvent in the amounts shown in Tables 2 and 3. Note that the basic compounds used are tributylamine (TBA), trismethoxymethoxyethylamine (TMMEA), tris(2-acetoxyethyl)amine (AAA), and N,N-bis(2-acetoxyethyl)-3-aminopropiononitrile (AACN), and the solvent used is propylene glycol monomethyl ether acetate (PGMEA).

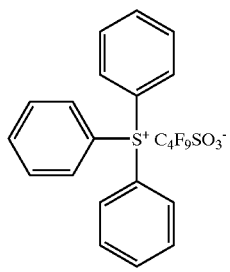

PAG i

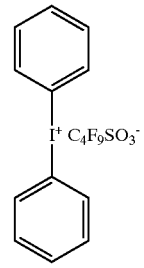

PAG ii

-continued

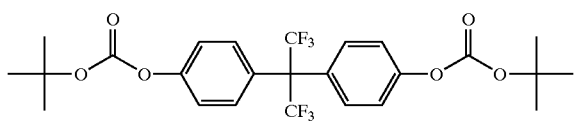

DRI 1

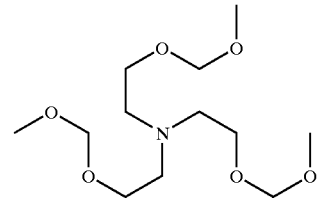

TMMEA

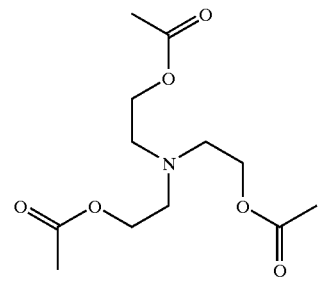

AAA

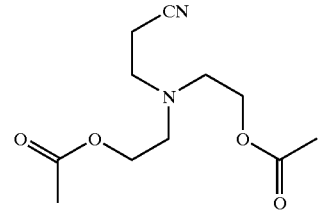

AACN

On silicon wafers having a film of DUV-30 (Brewer Science) coated to a thickness of 85 nm, the resist solutions were spin coated, then baked on a hot plate at 120° C. for 90 seconds to give resist films having a thickness of 200 nm. The resist films were exposed by means of an $F_2$ laser (VUVES-4500 by Lithotec Japan Co., Ltd.) while varying the exposure dose. Immediately after exposure, the resist films were baked (PEB) at 120° C. for 90 seconds and then developed for 60 seconds with a 2.38 wt % aqueous solution of tetramethylammonium hydroxide. The film thickness was measured in different dose areas. From the residual film thickness-to-dose relationship, the sensitivity (Eth) giving a film thickness 0 was determined. A γ value which was the slope (tan θ) of the characteristic curve was also determined.

Separately, through a mask having a Cr pattern formed on a $MgF_2$ substrate, the resist film in close contact with the Cr pattern surface was exposed to a $F_2$ laser for effecting contact exposure. The exposure was followed by similar PEB and development, forming a pattern. A cross section of the pattern was observed under SEM, the ascertainable minimum pattern size giving a resolution.

The results are shown in Tables 2 and 3.

Japanese Patent Application No. 2003-301500 is incorporated herein by reference.

Although some preferred embodiments have been described, many modifications and variations may be made thereto in light of the above teachings. It is therefore to be

TABLE 2

Working Examples

| Polymer (pbw) | Photoacid generator (pbw) | Basic compound (pbw) | Dissolution inhibitor (pbw) | Solvent (pbw) | Eth, mJ/cm$^2$ | γ | Resolution (μm) |
|---|---|---|---|---|---|---|---|
| Polymer 1 (80) + Polymer 2 (20) | PAG i (4) | TBA (0.2) | — | PGMEA (1000) | 12 | 10.8 | 0.12 |
| Polymer 1 (70) + Polymer 2 (30) | PAG i (4) | TBA (0.2) | — | PGMEA (1000) | 13 | 9.4 | 0.12 |
| Polymer 1 (80) + Polymer 3 (20) | PAG i (4) | TBA (0.2) | — | PGMEA (1000) | 11 | 12.8 | 0.14 |
| Polymer 1 (80) + Polymer 4 (20) | PAG i (4) | TBA (0.2) | — | PGMEA (1000) | 14 | 8.9 | 0.13 |
| Polymer 1 (80) + Polymer 5 (20) | PAG i (4) | TBA (0.2) | — | PGMEA (1000) | 12 | 8.2 | 0.13 |
| Polymer 1 (80) + Polymer 6 (20) | PAG i (4) | TBA (0.2) | — | PGMEA (1000) | 8 | 12.0 | 0.12 |
| Polymer 1 (90) + Polymer 7 (10) | PAG i (4) | TBA (0.2) | — | PGMEA (1000) | 8 | 10.3 | 0.13 |
| Polymer 1 (80) + Polymer 4 (20) | PAG i (4) | TMMEA (0.25) | — | PGMEA (1000) | 11 | 12.5 | 0.12 |
| Polymer 1 (80) + Polymer 4 (20) | PAG i (4) | AAA (0.25) | — | PGMEA (1000) | 13 | 13.5 | 0.12 |
| Polymer 1 (80) + Polymer 4 (20) | PAG i (4) | AACN (0.25) | — | PGMEA (1000) | 15 | 20.9 | 0.12 |
| Polymer 1 (80) + Polymer 4 (20) | PAG i (4) | TBA (0.2) | DRI1 (10) | PGMEA (1000) | 8 | 10.5 | 0.13 |
| Polymer 1 (80) + Polymer 4 (20) | PAG ii (4) | TBA (0.2) | — | PGMEA (1000) | 8 | 15.3 | 0.12 |

TABLE 3

Comparative Examples

| Polymer (pbw) | Photoacid generator (pbw) | Basic compound (pbw) | Dissolution inhibitor (pbw) | Solvent (pbw) | Eth, mJ/cm$^2$ | γ | Resolution (μm) |
|---|---|---|---|---|---|---|---|
| Polymer 1 (100) | PAG i (4) | TBA (0.2) | — | PGMEA (1000) | 13 | 5.3 | 0.16 |
| Polymer 2 (100) | PAG i (4) | TBA (0.2) | — | PGMEA (1000) | 18 | 18.6 | 0.16 |
| Polymer 3 (100) | PAG i (4) | TBA (0.2) | — | PGMEA (1000) | 16 | 12.3 | 0.17 |
| Polymer 4 (100) | PAG i (4) | TBA (0.2) | — | PGMEA (1000) | 8 | 15.5 | 0.18 |
| Polymer 5 (100) | PAG i (4) | TBA (0.2) | — | PGMEA (1000) | 6 | 12.8 | 0.16 |
| Polymer 6 (100) | PAG i (4) | TBA (0.2) | — | PGMEA (1000) | 3 | 13.5 | 0.18 |
| Polymer 7 (100) | PAG i (4) | TBA (0.2) | — | PGMEA (1000) | 4 | 12.2 | 0.2 |

As is evident from Tables 2 and 3, resist compositions using polymer blends within the scope of the invention have a high transparency at the wavelength (157 nm) of the $F_2$ laser. It is also confirmed that upon $F_2$ laser exposure, these resist compositions exert the positive working effect that the film thickness decreases with an increasing exposure dose as well as a high γ value and high contrast. They also exhibit a high resolution upon contact exposure and excellent resistance to dry etching.

understood that the invention may be practiced otherwise than as specifically described without departing from the scope of the appended claims.

What is claimed is:

1. A resist composition comprising a polymer comprising recurring units of the general formula (1) and a polymer comprising recurring units of the general formula (2):

(1)

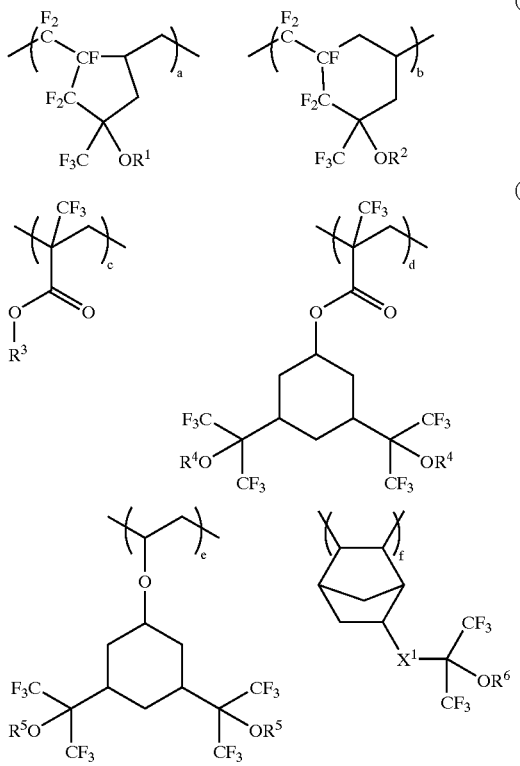

wherein $R^1$ and $R^2$ each are hydrogen or an acid labile group, letters a and b are numbers satisfying $0 \leq a \leq 1$, $0 \leq b \leq 1$ and $0.3 \leq a+b \leq 1$, $R^3$ is an acid labile group, $R^4$ and $R^5$ are each independently hydrogen, an alkyl group of 1 to 4 carbon atoms which may be substituted with a fluorine atom, cyano group or hydroxy group, or an acid labile group, $R^6$ is hydrogen, an alkyl group of 1 to 4 carbon atoms which may be substituted with a fluorine atom, cyano group or hydroxy group, or an acid labile group, $X^1$ is a single bond, methylene group or ethylene group, letters c, d, e and f are numbers satisfying $0 \leq c < 0.8$, $0 < d < 0.8$, $0 < c+d < 0.8$, $0 \leq e < 0.8$, $0 \leq f < 0.8$, $0 < e+f < 0.8$, and $0.5 \leq c+d+e+f \leq 1$.

2. A resist composition comprising a polymer comprising recurring units of the general formula (1) and a polymer comprising recurring units of the general formula (3):

(1)

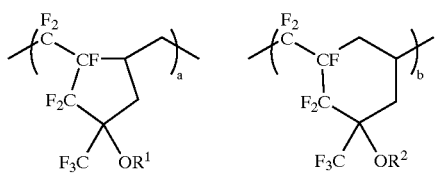

-continued (3)

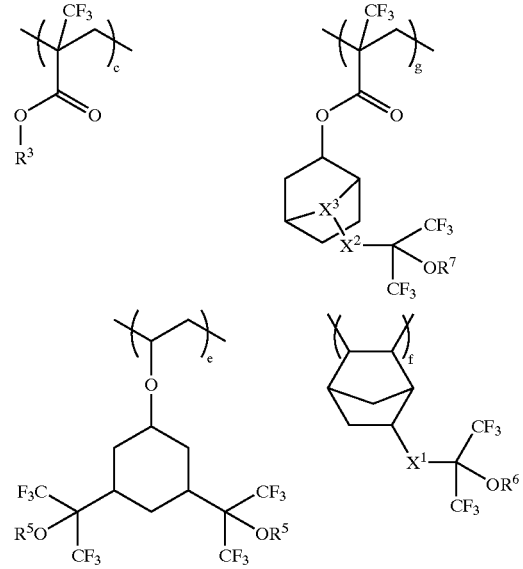

wherein $R^1$ to $R^3$, $R^5$, $R^6$, $X^1$, a and b are as defined in claim 1, $R^7$ is hydrogen, an alkyl group of 1 to 4 carbon atoms which may be substituted with a fluorine atom, cyano group or hydroxy group, or an acid labile group, $X^2$ is a single bond, methylene group or ethylene group, $X^3$ is a methylene group, ethylene group, oxygen atom or sulfur atom, letters c, g, e and f are numbers satisfying $0 \leq c < 0.8$, $0 < g < 0.8$, $0 < c+g < 0.8$, $0 \leq e < 0.8$, $0 \leq f < 0.8$, $0 < e+f < 0.8$, and $0.5 \leq c+g+e+f \leq 1$.

3. A chemically amplified positive resist composition comprising
(A) a blend of the polymers set forth in claim 1,
(B) an organic solvent, and
(C) a photoacid generator.

4. The resist composition of claim 3, further comprising (D) a basic compound.

5. The resist composition of claim 3, further comprising (E) a dissolution inhibitor.

6. A process for forming a resist pattern comprising the steps of:
applying the resist composition of claim 1 onto a substrate to form a coating,
heat treating the coating and then exposing it to high-energy radiation having a wavelength of up to 300 nm through a photomask, and
optionally heat treating the exposed coating and developing it with a developer.

7. The pattern forming process of claim 6 wherein the high-energy radiation is in a wavelength band of 100 to 180 nm or 1 to 30 nm.

8. The pattern forming process of claim 6 wherein the high-energy radiation is a KrF excimer laser beam, ArF excimer laser beam, $F_2$ laser beam, $Ar_2$ laser beam or soft x-ray.

* * * * *